(12) United States Patent
Takahashi

(10) Patent No.: US 6,655,790 B2
(45) Date of Patent: Dec. 2, 2003

(54) PIEZOELECTRIC ACTUATOR AND FLUID JET APPARATUS AND METHOD FOR MANUFACTURING THE PIEZOELECTRIC ACTUATOR AND THE FLUID JET APPARATUS

(75) Inventor: Yoshikazu Takahashi, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 103 days.

(21) Appl. No.: 10/097,354

(22) Filed: Mar. 15, 2002

(65) Prior Publication Data
US 2002/0140785 A1 Oct. 3, 2002

(30) Foreign Application Priority Data
Mar. 29, 2001 (JP) ........................................ 2001-095984
Dec. 7, 2001 (JP) ........................................ 2001-373868

(51) Int. Cl.[7] .............................................. B41J 2/045
(52) U.S. Cl. ...................................................... 347/72
(58) Field of Search ..................... 347/68–72; 310/365, 310/366

(56) References Cited

U.S. PATENT DOCUMENTS

| 4,353,046 A | * 10/1982 | Hartmann ................... 333/194 |
| 4,902,925 A | * 2/1990 | Wright ..................... 310/313 B |
| 5,128,694 A | 7/1992 | Kanayama |
| 5,266,964 A | 11/1993 | Takahashi et al. |
| 5,912,526 A | * 6/1999 | Okawa et al. .............. 310/328 |

* cited by examiner

*Primary Examiner*—Judy Nguyen
(74) *Attorney, Agent, or Firm*—Oliff & Berridge, PLC

(57) ABSTRACT

First internal electrodes are disposed in a piezoelectric laminate in association with each side of chambers, and second internal electrodes are disposed in association with central portions of the chambers. The first internal electrodes are interconnected by a first lead. The second internal electrodes are interconnected by a second lead. In a polarization process, a voltage is applied between all of the first and second internal electrodes at one time. Thereafter, grooves are formed on the piezoelectric laminate by removing the first and second leads, so that the first internal electrodes and the second internal electrodes can be separated individually.

28 Claims, 13 Drawing Sheets

PIEZOELECTRIC ACTUATOR AND FLUID JET APPARATUS AND METHOD FOR MANUFACTURING THE PIEZOELECTRIC ACTUATOR AND THE FLUID JET APPARATUS

BACKGROUND OF THE INVENTION

1. Field of Invention

The invention relates to a piezoelectric actuator and a fluid jet apparatus including the piezoelectric actuator and a manufacturing method for the piezoelectric actuator and the fluid jet apparatus.

2. Description of Related Art

A known fluid jet apparatus, for example, an ink-jet print head that ejects a droplet of fluid, such as ink, includes a piezoelectric element. Such ink-jet print head uses a plate member made of a piezoelectric material for a wall of a chamber that contains ink therein. Upon the application of a voltage to the piezoelectric material, the wall is deformed so as to apply pressure to the ink in the chamber. Therefore, the ink is ejected from a nozzle connected to the chamber.

The piezoelectric material is generally deformed in a shear mode or direct mode. In a direct mode, as a drive voltage is applied, a drive electric field is generated in the piezoelectric material in a direction parallel to a polarization direction of the piezoelectric material. The piezoelectric material deforms in direct mode in a direction parallel to the polarization direction of the piezoelectric material. In a shear mode, as a drive voltage is applied, a drive electric field is generated in the piezoelectric material in a direction substantially perpendicular to a polarization direction of the piezoelectric material. The piezoelectric material deforms in a direction of the shearing of the piezoelectric material.

A shear mode type ink-jet print head is disclosed in, for example, U.S. Pat. No. 5,266,964. The ink-jet print head disclosed in U.S. Pat. No. 5,266,964 includes internal electrodes used as electrodes for polarization, and external electrodes used as drive electrodes.

An ink-jet print head disclosed in U.S. Pat. No. 5,128,694 has slits formed in portions of a piezoelectric element which faces ink chambers. An area defined by the slits forms a first pressure portion, and a set of first electrodes is disposed in the first pressure portion. An area defined by the other slits forms a second pressure portion, and a set of second electrodes is disposed in the second pressure portion.

SUMMARY OF THE INVENTION

One aspect of the invention is to provide an improved piezoelectric actuator including internal electrodes and to provide a fluid jet apparatus including such a piezoelectric actuator.

Another aspect of the invention is to provide a method for manufacturing an improved piezoelectric actuator including internal electrodes and a fluid jet apparatus including such a piezoelectric actuator.

According to one aspect of the invention, a piezoelectric actuator may include a piezoelectric plate that is made of at least one sheet of piezoelectric material, a set of a plurality of first internal electrodes that are provided in one direction in the piezoelectric plate with a space therebetween, a set of a plurality of second internal electrodes that are provided in the one direction in the piezoelectric plate so as to correspond to the first internal electrodes with a space between the first internal electrodes and the second internal electrodes, and a groove that is formed in the one direction in the piezoelectric plate so as to expose ends of at least one of the set of the first internal electrodes and the set of the second internal electrodes. The piezoelectric material between the first internal electrodes and the second internal electrodes is polarized.

According to another aspect of the invention, a method for manufacturing a piezoelectric actuator may include the steps of forming in a piezoelectric plate that is made of at least one sheet of piezoelectric material, a first internal electrode pattern including a set of a plurality of first internal electrodes disposed in one direction with a space therebetween and a first lead that interconnects the first internal electrodes, and a second internal electrode pattern including a set of a plurality of second internal electrodes disposed in the one direction so as to correspond to the first internal electrodes with a space between the first internal electrodes and the second internal electrodes and a second lead that interconnects the second internal electrodes, polarizing the piezoelectric material between the first internal electrodes and the second internal electrodes in the one direction by applying an electric field between the first internal electrodes and the second internal electrodes through the first lead and the second lead, and separating at least one of the set of the first internal electrodes and the set of the second internal electrodes individually after the polarizing step, by removing at least one of the first lead and the second lead.

BRIEF DESCRIPTION OF THE DRAWINGS

Embodiments of the invention will be described in detail with reference to the following figures wherein.

DETAILED DESCRIPTION OF PREFERRED EMBODIMENTS

A first embodiment of the invention will be described in detail with reference to FIGS. 1 to 11.

Figure 1:
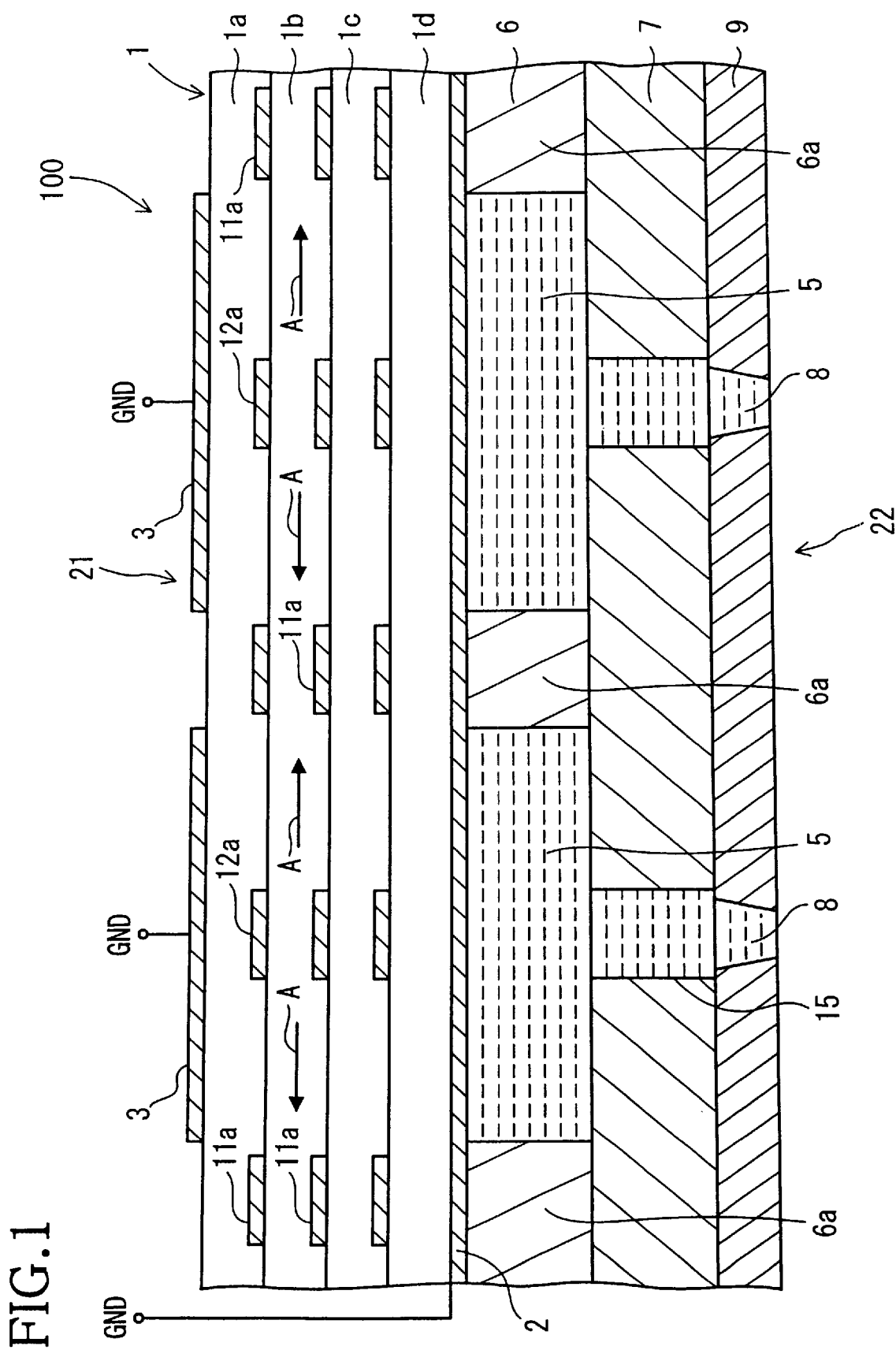
FIG. 1 is a sectional view of an ink-jet print head according to a first embodiment of the invention.
Figure 2:
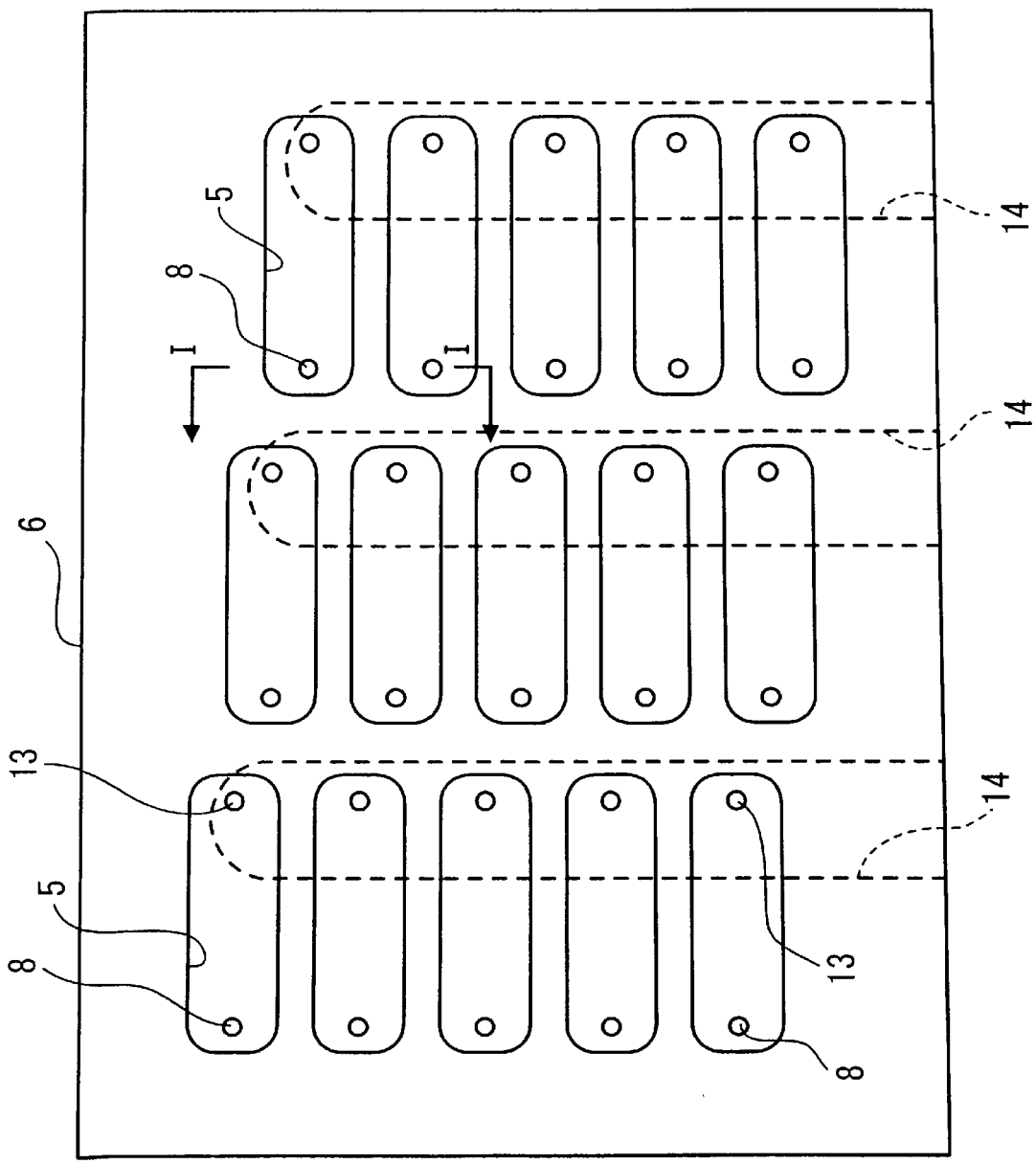
FIG. 2 is a plan view showing a positional relationship between a chamber and a nozzle, wherein a cross-section taken along line I—I is shown in FIG. 1.

As shown in FIGS. 1 and 2, an ink-jet print head 100 of a fluid jet apparatus according to the first embodiment includes a piezoelectric actuator 21 formed of a piezoelectric material, and a chamber plate unit 22 having an ink passage formed with an ink chamber and a nozzle. The piezoelectric actuator 21 and the chamber plate unit 22 are bonded to each other.

The piezoelectric actuator 21 includes a piezoelectric laminate 1, a first drive electrode 2, and second drive electrodes 3. The piezoelectric laminate 1 is formed of a plurality of sheets (four sheets in the first embodiment) 1a–1d that are made of the piezoelectric material. The sheets 1a–1d are laminated and sintered to form the piezoelectric laminate 1. The first drive electrode 2 is formed on a lower surface of the piezoelectric laminate 1 in FIG. 1 to a side of the chamber plate unit 22. The second drive electrodes 3 are formed on an upper surface of the piezoelectric laminate 1 opposite to the side that the first drive electrode 2 is formed. The chamber plate unit 22 includes a first chamber plate 6, a second chamber plate 7, and a nozzle plate 9 that are stacked and integrally formed. The first chamber plate 6 has a plurality of chambers 5 formed as through holes. The second chamber plate 7 has common ink chambers 14 (in FIGS. 2 and 9), each of which supply ink to a plurality of the chambers 5. The nozzle plate 9 has a plurality of nozzle openings 8 formed thereon. The second chamber plate 7 includes supply openings 13 (FIG. 2) that connect the common ink chamber 14 and the chambers 5 at one end of the chambers 5, and through-holes 15 (FIG. 1) that connect the nozzle openings 8 and the chambers 5 at the other end of the chambers 5.

Figure 9:
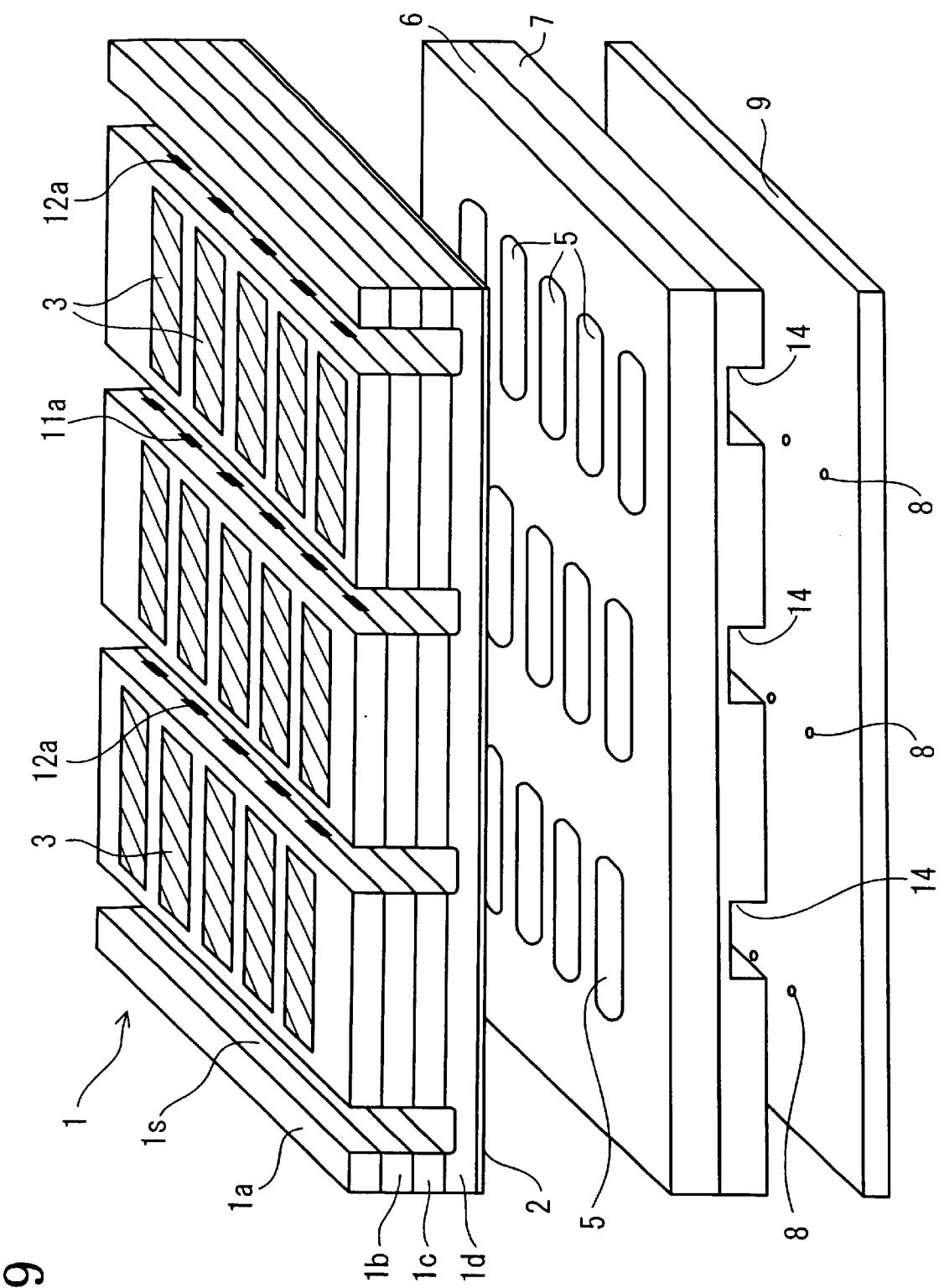
FIG. 9 is a perspective view showing the assembly of the ink-jet print head.

As shown in FIG. 2, the chambers 5 are arranged in a plurality of rows and columns, preferably at least five rows and three columns. As shown in FIG. 1, partition walls 6a are provided between adjacent chambers 5. The piezoelectric laminate 1 is fixedly bonded to the chamber plate unit 22 while covering the chambers 5 such that a portion of the piezoelectric laminate 1 polarized, as will be described below, is associated with each chamber 5. The first drive electrode 2 is common to a plurality of the chambers 5. The second drive electrode 3 is provided so as to correspond to each chamber 5, and is formed in a shape associated with the shape of the chamber 5 (FIG. 9).

Arrows A in FIG. 1 indicate polarization directions in the piezoelectric laminate 1. The piezoelectric material of the piezoelectric laminate 1 is polarized in opposite directions with respect to a lateral direction of a central portion of each chamber 5. The polarization directions A are substantially parallel to a plane of the piezoelectric laminate 1.

A method of manufacturing the ink-jet print head 100 will be described below with reference to FIGS. 3 to 8.

Figure 3:
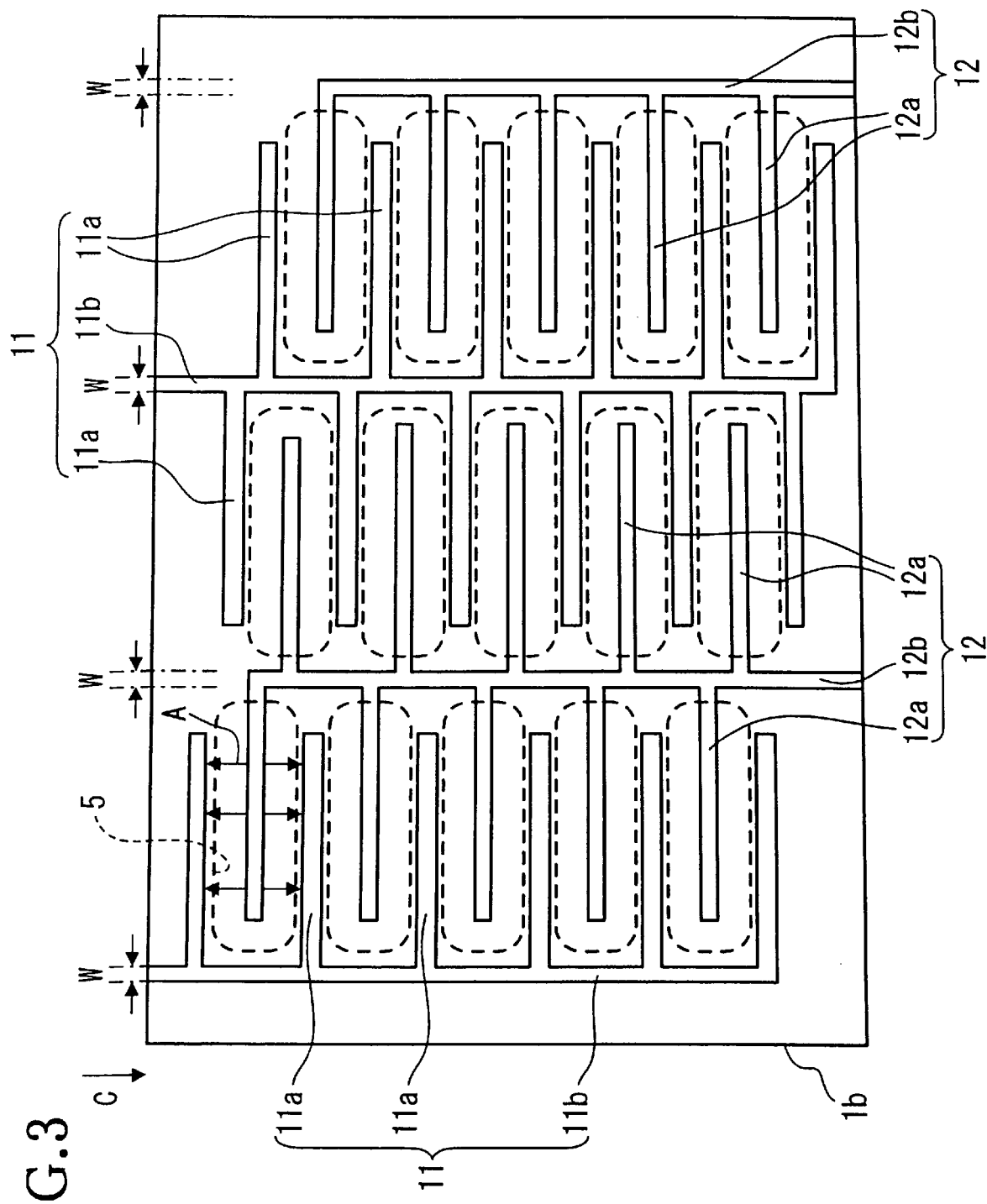
FIG. 3 is a plan view showing an arrangement of internal electrodes.

As shown in FIG. 3, a first electrode pattern 11 and a second electrode pattern 12 are formed of an electrically conductive material on each sheet 1b–1d by, for example, screen printing. The first electrode pattern 11 includes a plurality of first internal electrodes 11a and a first lead 11b that connects the plurality of the first internal electrodes 11a. The first internal electrodes 11a are provided on the sheets 1b–1d along each longer side or longitudinal direction of the chamber 5, so that the internal electrodes 11a are associated with the partition walls 6a and the chamber 5 is placed between the internal electrodes 11a. The first lead 11b extends in the direction of a row of the chambers 5 (upper to lower direction in FIG. 3) to an edge of each sheet 1b–1d other than the sheet 1a. The second electrode pattern 12 includes a plurality of second internal electrodes 12a and a second lead 12b that connects the plurality of the second internal electrodes 12a. The second internal electrodes 12a are provided on the sheets 1b–1d at positions corresponding to a central portion of each chamber 5, so as to extend along the longitudinal direction of the chamber 5. The second lead 12b extends in the direction of a row of the chambers 5, similar to the first lead 11b, to an edge of each sheet 1b–1d. The leads 11b, 12b are provided in the sheets 1b–1d, so as to extend along each longer side end of the rows of the chambers 5 (a direction perpendicular to the internal electrodes). The leads 11b, 12b are shared by the internal electrodes 11a, 12a, respectively, that extend in opposite directions. Such internal electrodes 11a, 12a extending in opposite directions are provided in association with the adjacent rows of the chambers 5. An electrode combination including the first and second electrode patterns 11, 12 is provided in association with each row of the chambers 5. The connection between the first leads 11b or between the second leads 12b may be made. The internal electrodes 11a are symmetrical with respect to a second internal electrode 12a, extending along the longitudinal direction of the chambers 5.

Figure 4:
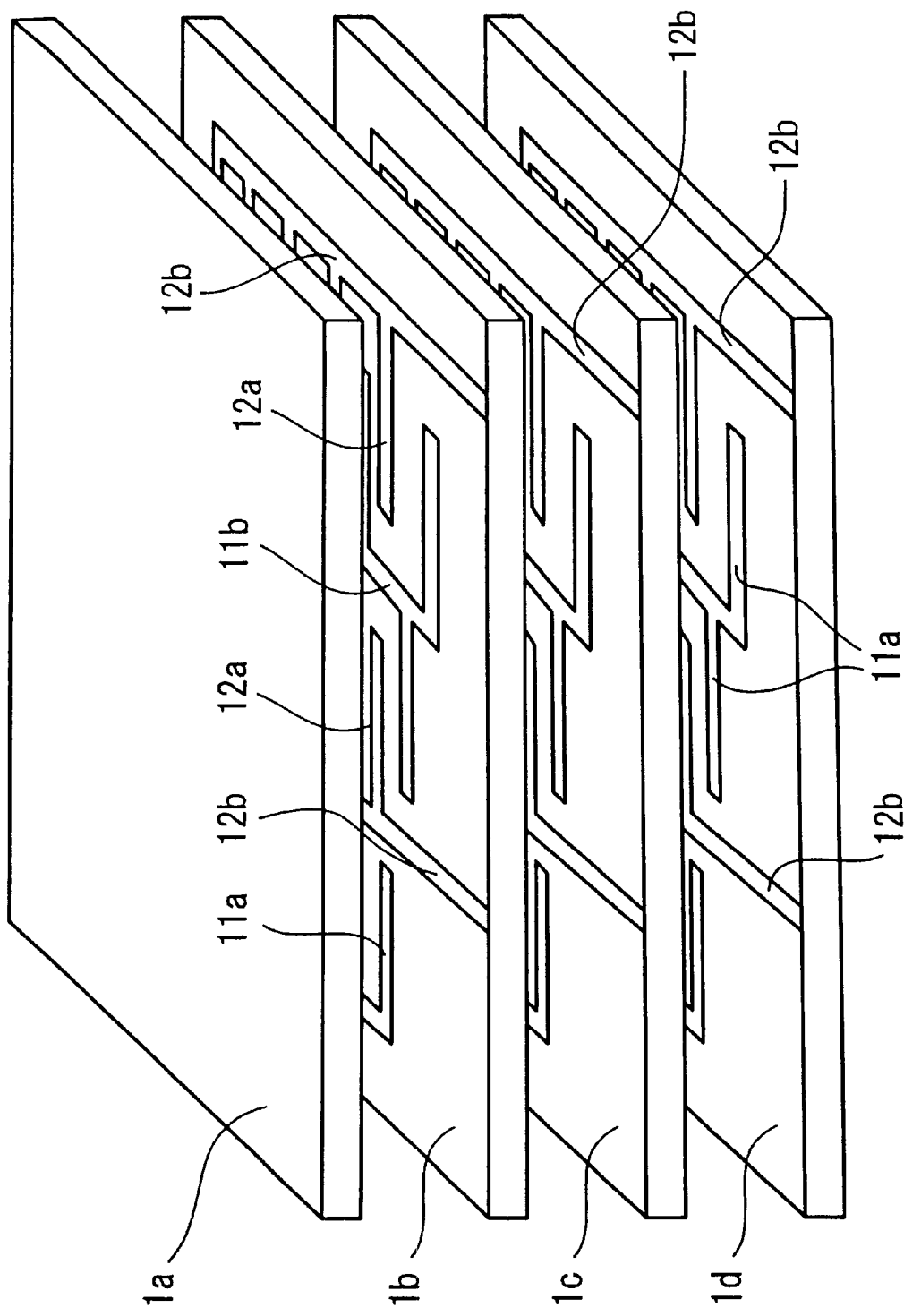
FIG. 4 is a perspective view showing a laminating condition of sheets made of a piezoelectric material.
Figure 5:
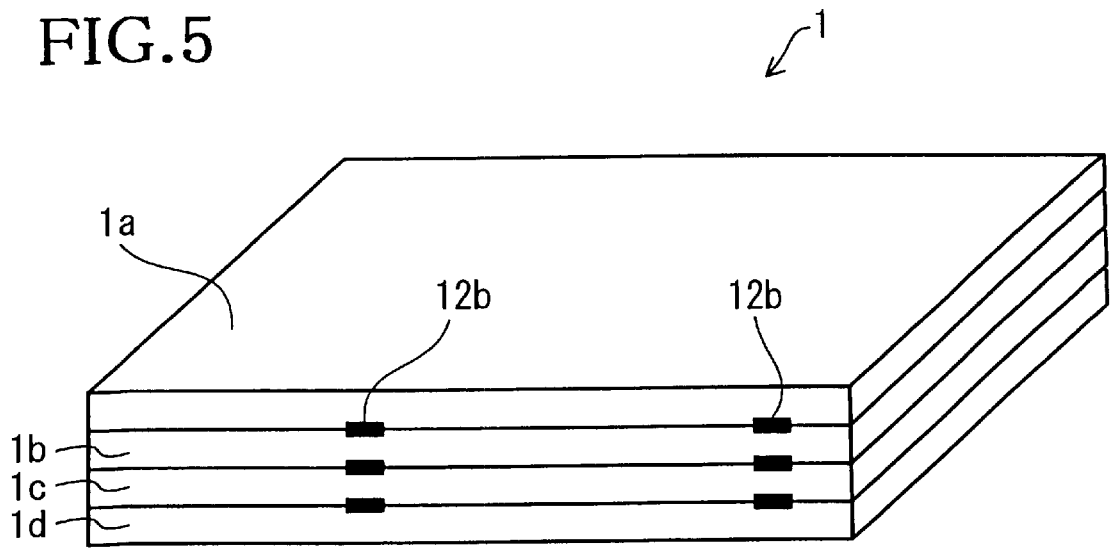
FIG. 5 is a perspective view of a laminate of the sheets after sintering.
Figure 6:
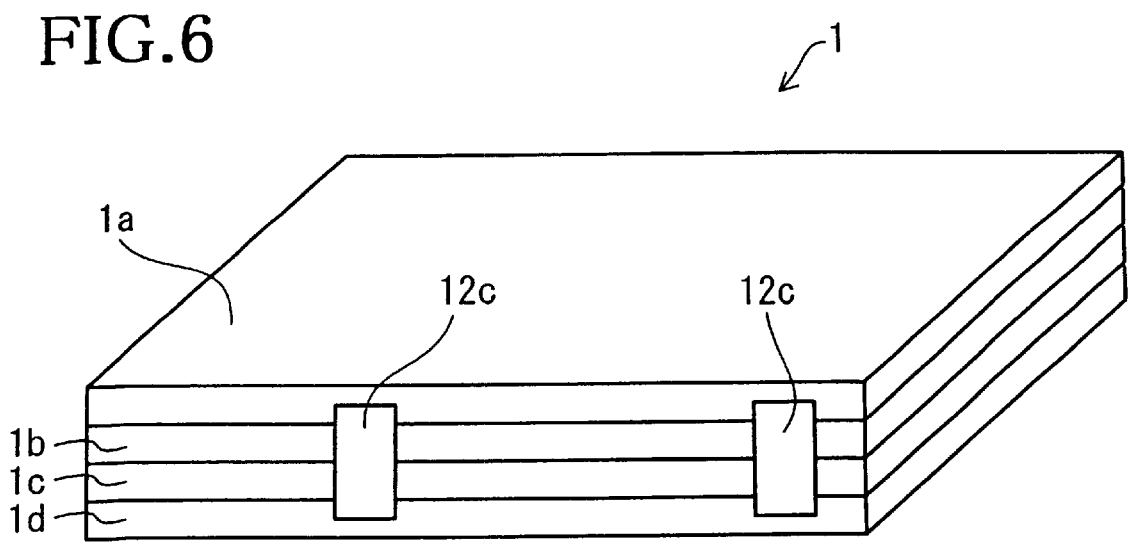
FIG. 6 is a perspective view of the laminate of the sheets with side electrodes formed thereon.

As shown in FIG. 4, the sheets 1b–1d having the first and second electrode patterns 11, 12 are stacked with the sheet 1a that has no first or second electrode patterns 11, 12 on the top. Next, the stacked sheets 1a–1d are sintered, forming a single piezoelectric laminate 1, as shown in FIG. 5. Ends of the first and second leads 11b, 12b are exposed on faces of the piezoelectric laminate 1 (only the ends of the second leads 12b are shown in FIG. 5). Thereafter, as shown in FIG. 6, connecting portions 12c are provided so as to connect the ends of the second leads 12b aligning on the face of the piezoelectric laminate 1 along the laminating direction thereof. Similar to the connecting portion 12c, connecting portions 11c are provided so as to connect the ends of the first leads 11b aligning on the opposite face (not shown in FIG. 6) of the piezoelectric laminate 1 along the laminating direction thereof. The connecting portions 11c, 12c are formed of an electrically conductive material. The first electrode patterns 11 formed on the sheets 1b–1d are interconnected by the connecting portions 11c. The second electrode patterns 12 formed on the sheets 1b–1d are interconnected by the connecting portions 12c.

Figure 7:
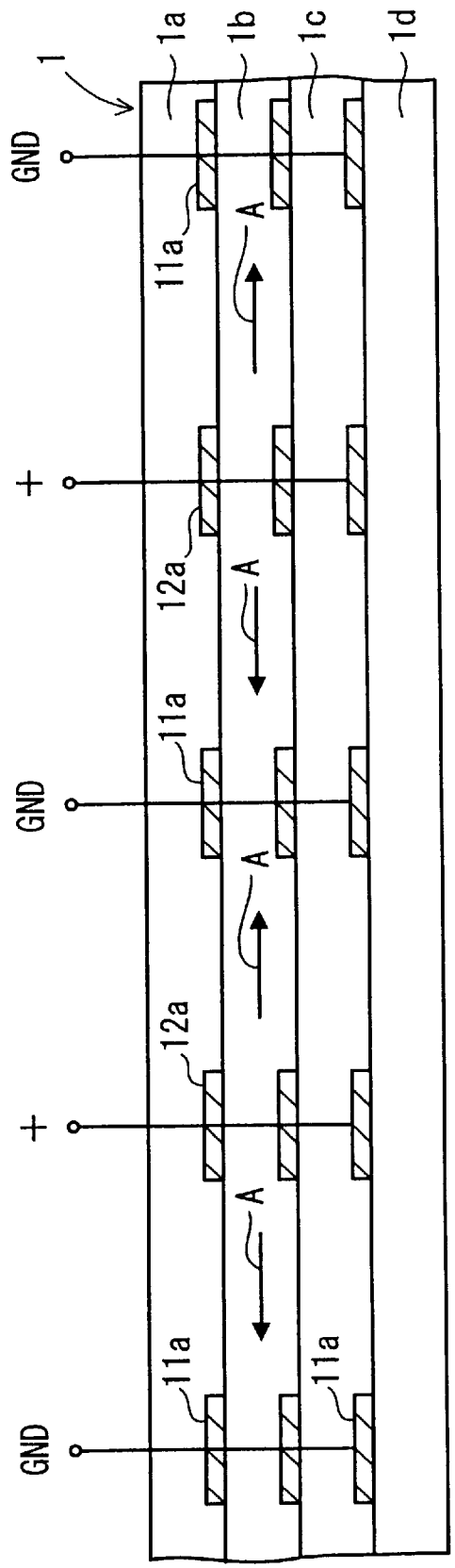
FIG. 7 is a sectional view of the laminate showing a polarization process.

To polarize the piezoelectric material of the laminate 1, the connecting portions 11c of the first electrode pattern 11 are connected to a ground, and the connecting portions 12c of the second electrode pattern 12 are connected to positive potential, as shown in FIG. 7. A voltage is applied between the internal electrodes 11a, 12a associated with each of the chambers 5, so that the electric field is applied to a portion in the piezoelectric laminate 1 between the first internal electrode 11a and the second internal electrode 12a. Thus, the portion of the piezoelectric laminate 1 is polarized in the direction A (indicated by arrows in FIGS. 3 and 9) from the second internal electrode 12a to the first internal electrode 11a, providing piezoelectric properties.

Figure 8:
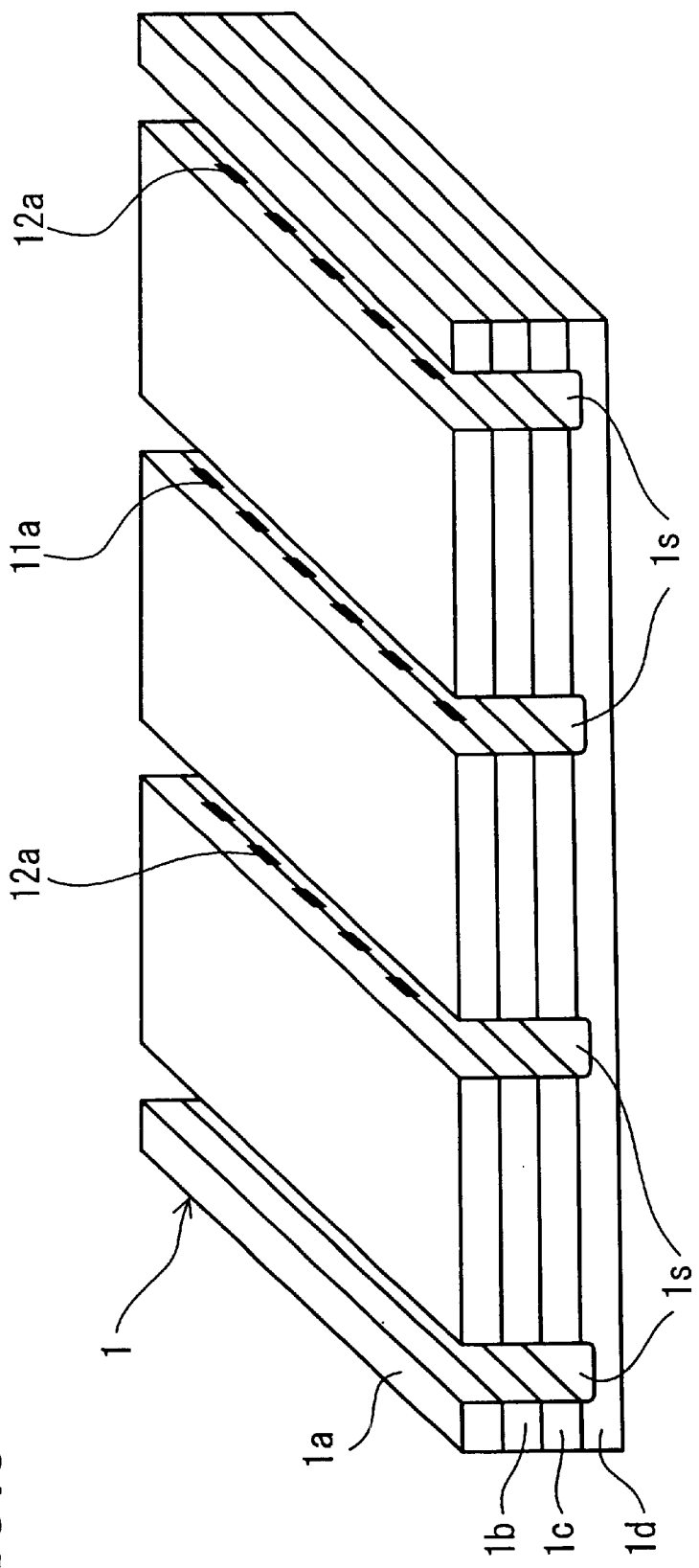
FIG. 8 is a perspective view of the laminate with grooves formed thereon to separate the internal electrodes.

As shown in FIG. 8, grooves 1s are formed in the piezoelectric laminate 1 to separate the internal electrodes 11a, 12a individually. More specifically, each layer of the piezoelectric laminate 1 is removed by, for example, a diamond blade, to form the grooves 1s having the width equal to or greater than the width W (FIG. 3) of the first and second leads 11b, 12b, along a direction C (FIG. 3). After the grooves is are formed, the internal electrodes 11a, 12a still remain inside the piezoelectric laminate 1. Ends of the internal electrodes 11a, 12a are flush with cut surfaces of the piezoelectric laminate 1 where the grooves 1s are formed, and exposed on side faces of the grooves 1s.

As shown in FIG. 9, the first and second drive electrodes 2, 3 are formed on the surfaces of the piezoelectric laminate 1 by, for example, printing or deposition. Thus, the piezoelectric actuator 21 is manufactured. The piezoelectric actuator 21 is bonded to the chamber plate unit 22 including the first chamber plate 6, the second chamber plate 7, and the nozzle plate 9 that are laminated, to form the ink-jet print head 100.

The first and second drive electrodes 2, 3 may be formed on a lower surface of the sheet 1d and an upper surface of the sheet 1a, respectively, before the sheets 1a–1d are sintered. Further, after the piezoelectric actuator 21 is bonded to the chamber plate unit 22, the polarization process may be performed to polarize the piezoelectric material and then the grooves 1s may be formed on the piezoelectric laminate 1.

In the ink-jet print head 100 according to the first embodiment, the first and second electrode patterns 11, 12 are provided for each of the chambers 5. Using the first and second electrode patterns 11, 12, the piezoelectric material of the piezoelectric laminate 1 is polarized. Therefore, a plurality of portions of the piezoelectric laminate 1 are polarized at one time without requiring complicated operations, in such a manner that the portions are polarized in the opposite directions alternately. After the piezoelectric material of the piezoelectric laminate 1 is polarized, the grooves 1s are formed in the piezoelectric laminate 1. Accordingly, the first and second internal electrodes 11a, 12a are separated individually so as to correspond to each of the chambers 5. Due to the grooves 1s, a voltage applied to drive the ink-jet head 100 between the first and second drive electrodes 2, 3 corresponding to desired chamber 5 does not leak to the piezoelectric material corresponding to other chambers 5 through the first and second internal electrodes 11a, 12a. Therefore, crosstalk can be prevented.

Referring to FIGS. 1, 2, 10 and 11, an ink ejection operation will be described below.

Figure 10:
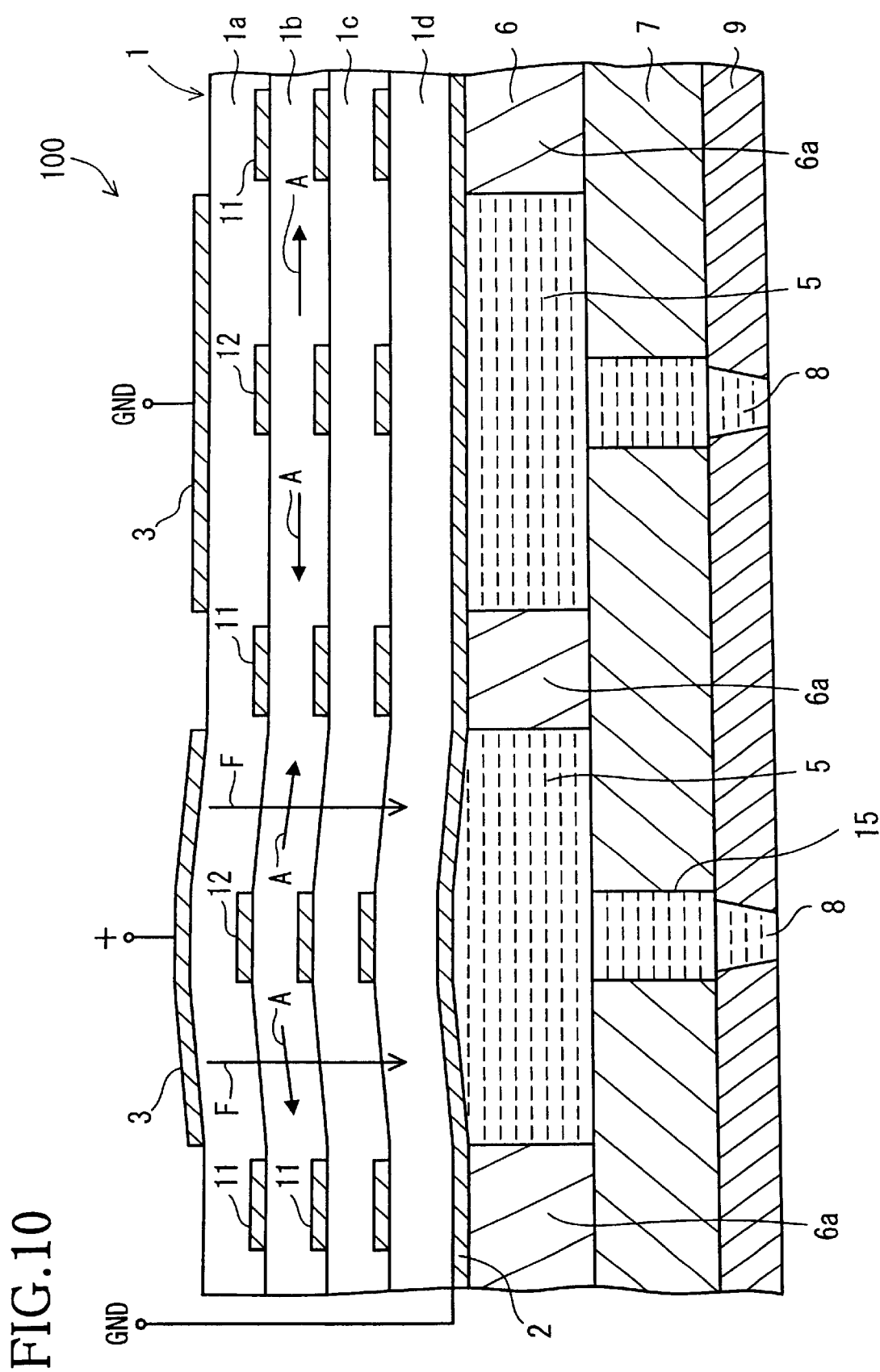
FIG. 10 is a sectional view of the ink-jet print head to which a drive voltage is applied.

Ink is supplied from an ink supply source (not shown) to each chamber 5 through the common ink chambers 14 and the supply openings 13, as shown in FIG. 2. At this time, the first drive electrode 2 and the second drive electrode 3 are connected to a ground (0 V), as shown in FIG. 1. Thereafter, while the first drive electrode 2 is connected to a ground as shown in FIG. 10, a positive voltage is applied to the second drive electrode 3 corresponding to the chamber 5 from which the ink is to be ejected. At this time, an electric field is generated between the first and second drive electrodes 2, 3 in a direction F. The direction F is substantially perpendicular to the polarization direction A in which the piezoelectric material of the piezoelectric laminate 1 is polarized. The piezoelectric laminate 1 deforms in shear mode. More specifically, as shown in FIG. 10, the piezoelectric material sandwiching the internal electrodes 12a is symmetrically deformed, and the piezoelectric material corresponding to a central portion of the chamber 5 is raised. Accordingly, the volumetric capacity of the chamber 5 is increased.

Figure 11:
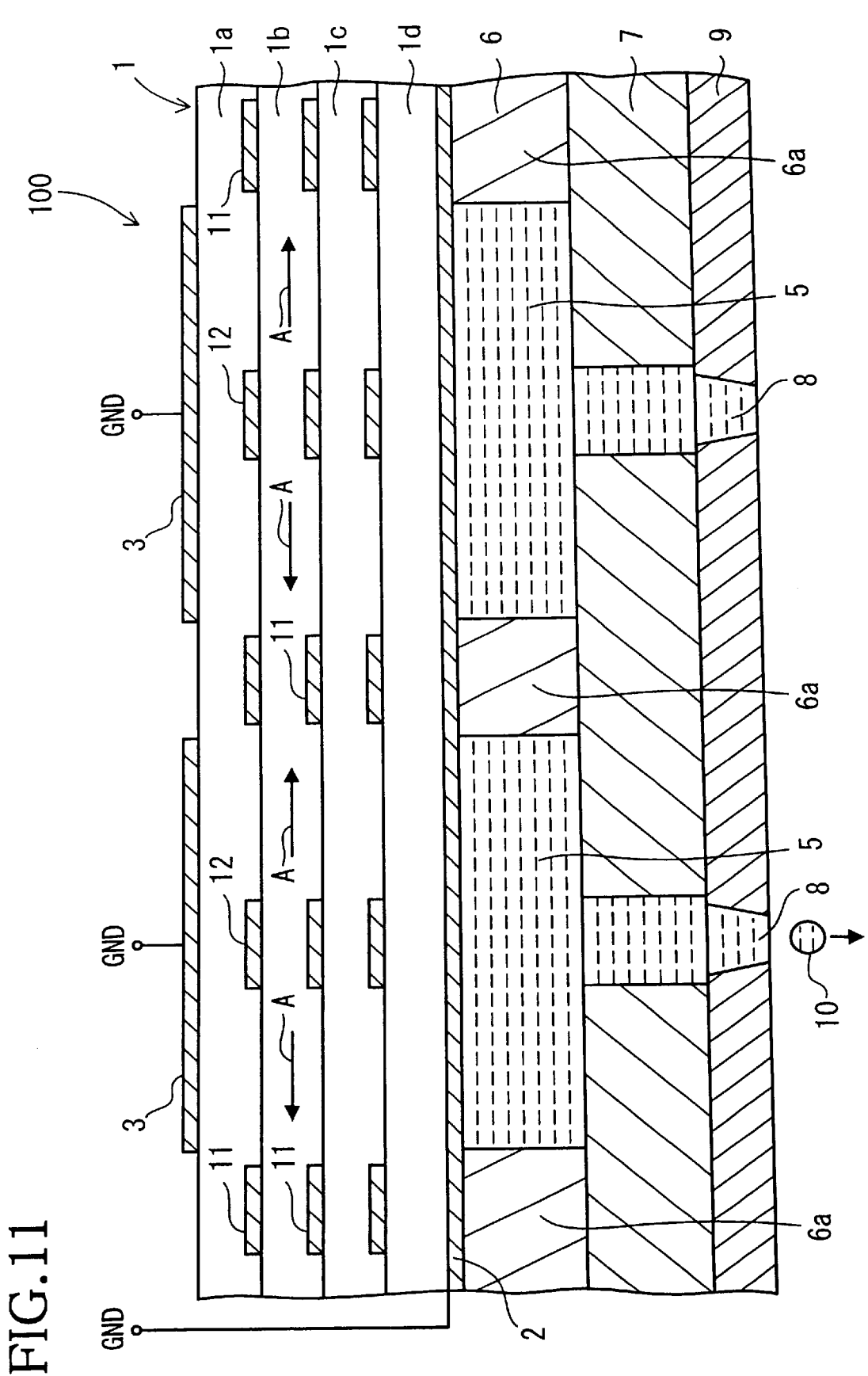
FIG. 11 is a sectional view of the ink-jet print head to which an application of the drive voltage is stopped.

As the second drive electrode 3 is connected to a ground (0 V) again while the first drive electrode 2 is connected to a ground, the piezoelectric laminate 1 returns to its original state before being deformed, as shown in FIG. 11. At this time, a pressure is applied to the ink in the chamber 5, so that a predetermined amount of a droplet of ink 10 is ejected from the nozzle opening 8.

In the first embodiment, the first and second internal electrodes 11a, 12a are separated individually. However, if crosstalk can be effectively suppressed, either internal electrodes 11a or 12a, preferably, the internal electrodes 12a disposed below the drive electrode 3 to which positive voltage is applied, may be separated individually.

Figure 12:
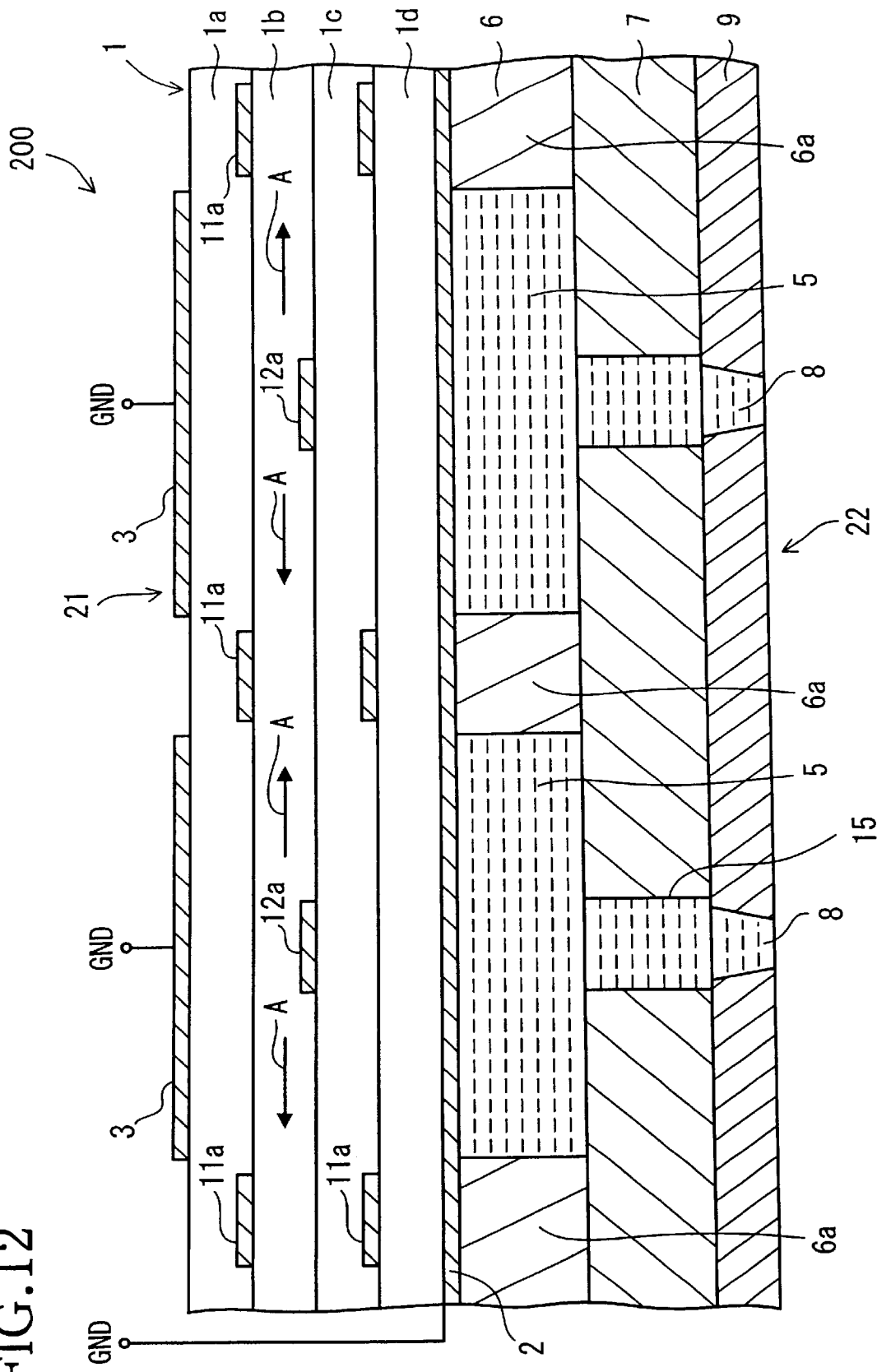
FIG. 12 is a sectional view of an ink-jet print head according to a second embodiment of the invention.

An ink-jet print head 200 according to a second embodiment of the invention will be described below with reference FIGS. 12–14. It is to be noted that similar numerals denote components similar to those in the first embodiment, and a detailed explanation thereof with respect to the second embodiment is omitted. The piezoelectric actuator 21 and the chamber plate unit 22 of the second embodiment are substantially the same as those of the first embodiment, except for the arrangement of the internal electrodes provided in the piezoelectric actuator 21.

Figure 13:
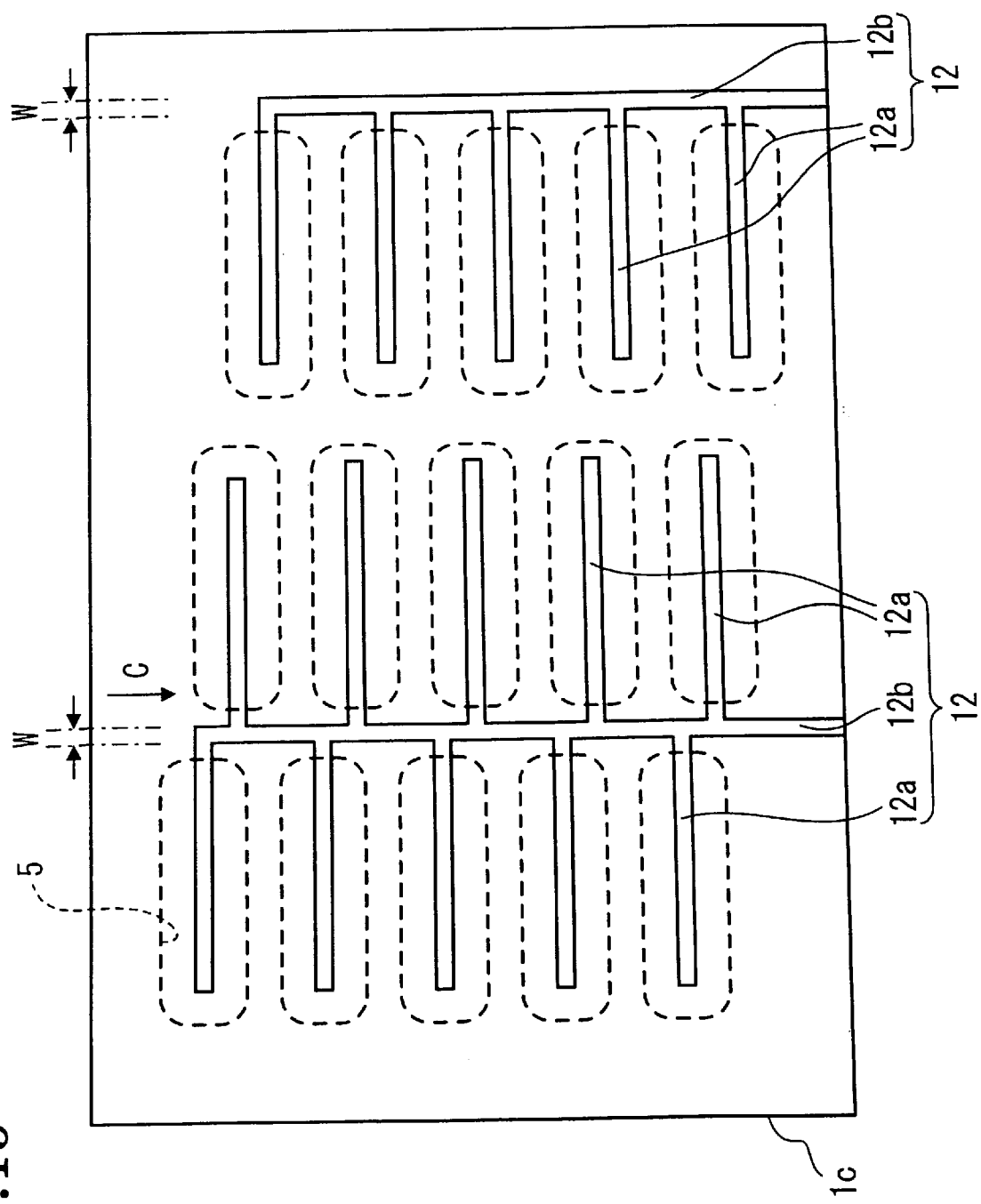
FIG. 13 is a plan view showing an arrangement of internal electrodes formed on one of the sheets according to the second embodiment of the invention.
Figure 14:
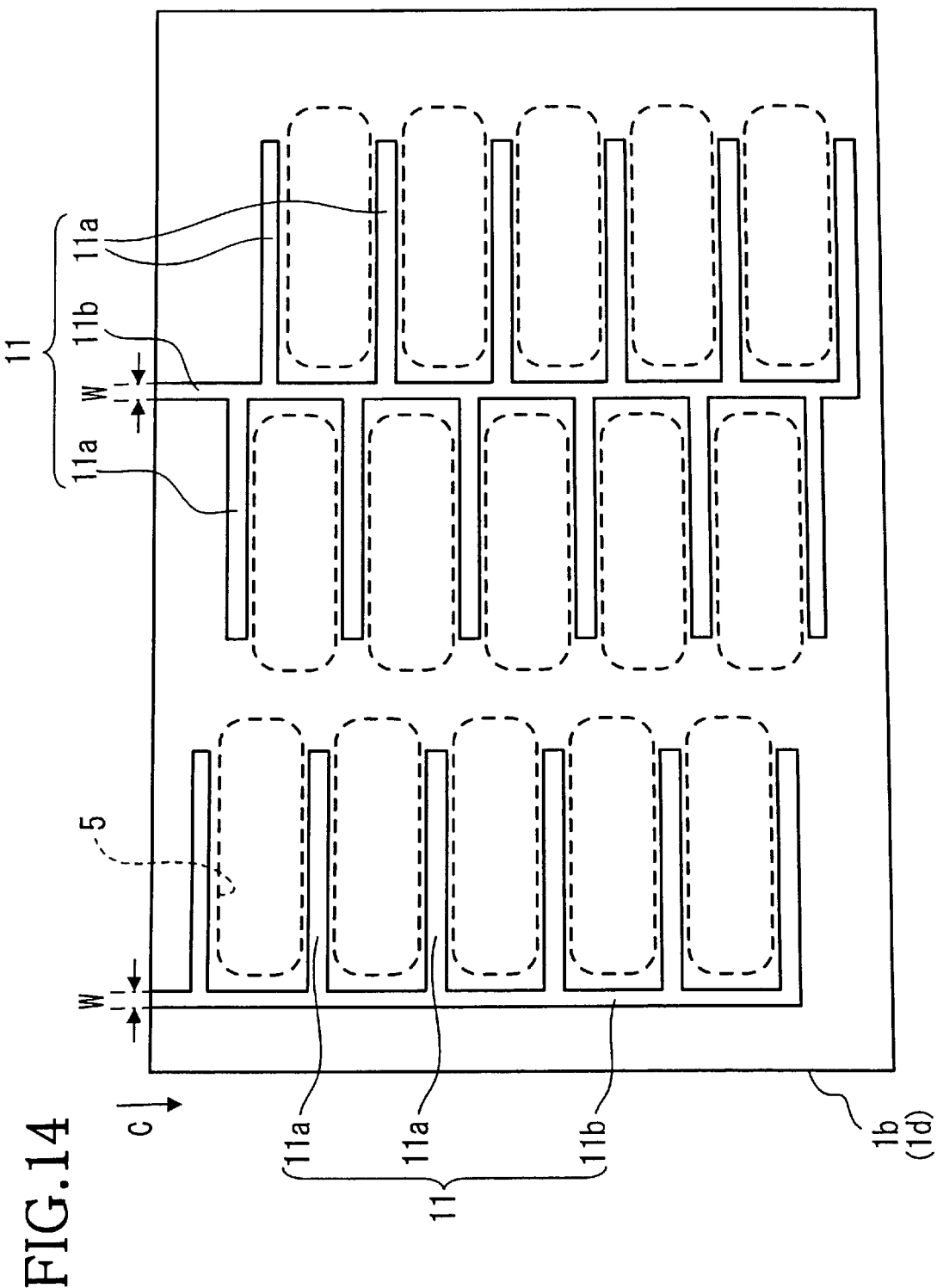
FIG. 14 is a plan view showing an arrangement of internal electrodes formed on another sheet according to the second embodiment of the invention.

As shown in FIG. 13, the internal electrodes 12a of the piezoelectric actuator 21 are formed on an upper surface of, for example, the sheet 1c, so as to correspond to a central portion of each chamber 5 along the longitudinal direction. As shown in FIG. 14, the internal electrodes 11a are formed on an upper surface of another sheet 1b, 1d, so as to sandwich the central portion of the chamber 5 along the partition walls 6a in the longitudinal direction of the chamber 5. The sheet 1c having the internal electrode 12b formed thereon is sandwiched between the sheets 11b, 11d having the internal electrodes 11a. On the top of the stacked sheets 1b–1d, the sheet 1a is placed, as shown in FIG. 12. Next, the laminated sheets 1a–1d are sintered. The positional relationship between the first and second internal electrodes 11a, 12a in a planar view is substantially the same as that in the first embodiment. The only difference between the first embodiment and the second embodiment is that the first and second internal electrodes 11a, 12a are provided on different sheets of the piezoelectric material. The first and second leads 11b, 12b are formed in the similar shape as those of the first embodiment. The first and second leads 11b, 12b are removed when the grooves 1s are formed after the polarization process, as described below.

Similar to the first embodiment, when a voltage is applied between the first and second electrodes 11a, 12a in the polarization process, the piezoelectric material between the first and second electrodes 11a, 12a is polarized in the direction A (FIG. 12) from the second internal electrode 12a to the first internal electrode 11a. Because the first and second electrodes 11a, 12a are not provided on the same plane, the voltage applied during the polarization process is not discharged from the interface of layers of the piezoelectric laminate 1. Accordingly, the polarization process can be effectively performed. If necessary, the sheets having the first and second internal electrodes 11a, 12a are increased in number and laminated alternately.

Similar to the first embodiment, when a voltage is applied between the first and second drive electrodes 2, 3, the piezoelectric material corresponding to the central portion of the chamber 5 is raised so as to increase the volumetric capacity of the chamber 5, by deforming in the shear mode. When the application of the voltage is stopped, the piezoelectric laminate 1 returns to its original state and the ink 10 is ejected from the nozzle opening 8.

In the above-described embodiments, the piezoelectric laminate 1 is driven in the shear mode. However, the piezoelectric laminate 1 may be driven in the direct mode according to the arrangement of the first and second internal electrodes 11a, 12a. More specifically, the first and second drive electrodes 2,3 are provided similar to those in FIG. 1, although a width of each second drive electrode 3 is reduced. With this structure, the angle formed by the direction F of the generated electric field and the direction A of the polarization becomes smaller. Thus, the piezoelectric actuator 21 can be operated in the direct mode.

Application of the fluid jet apparatus of the invention is not limited to an ink-jet printer. The fluid jet apparatus may be applied to various printing devices and fluid applying devices.

Portions of the piezoelectric laminate 1 that are to be actuated are polarized using the first and second internal electrodes 11a, 12a, each of which are interconnected. Thereafter, the grooves 1s are formed on the piezoelectric laminate 1. Accordingly, the first and second internal electrodes 11a, 12a are separated in association with each portion to be actuated. Thus, polarization can be readily preformed and further, crosstalk can be prevented.

While the invention has been described with reference to the embodiments, it is to be understood that the invention is not restricted to the particular forms shown in the foregoing embodiments. Various modifications and alterations can be made thereto without departing from the scope of the invention, as set forth in the appended claims.

What is claimed is:

1. A piezoelectric actuator, comprising:
  a piezoelectric plate that is made of at least one sheet of piezoelectric material;
  a set of a plurality of first internal electrodes that are provided in one direction in the piezoelectric plate with a space therebetween;
  a set of a plurality of second internal electrodes that are provided in the one direction in the piezoelectric plate so as to correspond to the set of the first internal electrodes with a space between the set of the first internal electrodes and the set of the second internal electrodes; and
  a groove that is formed in the one direction in the piezoelectric plate so as to expose ends of at least one of the set of the first internal electrodes and the set of the second internal electrodes, wherein the piezoelectric material between the first internal electrodes and the second internal electrodes is polarized.

2. The piezoelectric actuator according to claim 1, wherein a direction that the piezoelectric material is polarized is the one direction.

3. The piezoelectric actuator according to claim 2, wherein the piezoelectric plate includes drive electrodes that are formed on surfaces thereof and that generate a drive electric field in a direction perpendicular to the direction that the piezoelectric material is polarized.

4. The piezoelectric actuator according to claim 1, wherein the piezoelectric plate is formed of a plurality of sheets of the piezoelectric material and the first internal electrodes and the second internal electrodes are disposed between the sheets.

5. The piezoelectric actuator according to claim 1, wherein the piezoelectric plate is formed of a plurality of sheets of the piezoelectric material and the first internal electrodes and the second internal electrodes are separately disposed on different ones of the sheets.

6. The piezoelectric actuator according to claim 1, wherein the set of the first internal electrodes and the set of the second internal electrodes form an internal electrode combination and a plurality of the internal electrode combinations are provided in the piezoelectric plate along a direction perpendicular to the one direction.

7. A method of manufacturing a piezoelectric actuator, comprising the steps of:
  forming in a piezoelectric plate that is made of at least one sheet of piezoelectric material, a first internal electrode pattern including a set of a plurality of first internal electrodes disposed in one direction with a space therebetween and a first lead that interconnects the set of the first internal electrodes, and a second internal electrode pattern including a set of a plurality of second internal electrodes disposed in the one direction so as to correspond to the set of the first internal electrodes with a space between the set of the first internal electrodes and the set of the second internal electrodes and a second lead that interconnects the set of the second internal electrodes;
  polarizing the piezoelectric material between the set of the first internal electrodes and the set of the second internal electrodes in the one direction by applying an electric field between the set of the first internal electrodes and the set of the second internal electrodes through the first lead and the second lead; and
  separating at least one of the set of the first internal electrodes and the set of the second internal electrodes individually after the polarizing step, by removing at least one of the first lead and the second lead.

8. The method according to claim 7, further comprising a step of making drive electrodes on the piezoelectric plate that generate a drive electric field in a direction perpendicular to the one direction that the piezoelectric material is polarized.

9. The method according to claim 7, further comprising the steps of producing a plurality of sheets of the piezoelectric material and laminating the plurality of the sheets, wherein the step of forming the first internal electrode pattern and the second internal electrode pattern occurs before the step of laminating the sheets.

10. The method according to claim 9, wherein the step of forming includes forming the set of the first internal electrodes and the set of the second internal electrodes on each of the sheets and interconnecting the set of the first internal electrodes and the set of the second internal electrodes by the first lead and the second lead, respectively.

11. The method according to claim 9, wherein the step of forming includes forming the set of the first internal electrodes and the set of the second internal electrodes separately on different ones of the sheets and interconnecting the set of the first internal electrodes and the set of the second internal electrodes by the first lead and the second lead, respectively.

12. The method according to claim 9, further comprising the steps of forming an internal electrode combination by combining the first internal electrode pattern and the second internal electrode pattern, wherein a plurality of the internal electrode combinations are formed in the piezoelectric plate along a direction perpendicular to the one direction, and interconnecting the first lead in each of the internal electrode combinations and the second lead in each of the internal electrode combinations.

13. The method according to claim 9, wherein the step of separating includes forming a groove in the laminated sheets.

14. The method according to claim 13, wherein the step of forming the groove includes having a groove width equal to or greater than a width of the at least one of the first lead and the second lead.

15. A fluid jet apparatus, comprising:
  a chamber plate unit that includes a plurality of chambers separated by partition walls and nozzles connected to the chambers to eject fluid from the chambers; and
  a piezoelectric actuator that is laminated with the chamber plate unit and includes:

a piezoelectric plate that is made of at least one sheet of piezoelectric material and has drive electrodes on a surface thereof;

a set of a plurality of first internal electrodes that are provided in one direction in the piezoelectric plate with a space therebetween;

a set of a plurality of second internal electrodes that are provided in the one direction in the piezoelectric plate so as to correspond to the set of the first internal electrodes with a space between the set of the first internal electrodes and the set of the second internal electrodes; and a groove that is formed in the one direction in the piezoelectric plate so as to expose ends of at least one of the set of the first internal electrodes and the set of the second internal electrodes, wherein the piezoelectric material between the set of the first internal electrodes and the set of the second internal electrodes is polarized.

16. The fluid jet apparatus according to claim 15, wherein a direction that the piezoelectric material is polarized is the one direction.

17. The fluid jet apparatus according to claim 16, wherein the drive electrodes generate a drive electric field in a direction perpendicular to the direction that the piezoelectric material is polarized.

18. The fluid jet apparatus according to claim 15, wherein the piezoelectric plate is formed of a plurality of sheets of the piezoelectric material and the first internal electrodes and the second internal electrodes are disposed between the sheets.

19. The fluid jet apparatus according to claim 15, wherein the piezoelectric plate is formed of a plurality of sheets of the piezoelectric material and the first internal electrodes and the second internal electrodes are disposed separately on different ones of the sheets.

20. The fluid jet apparatus according to claim 15, wherein one of the set of the first internal electrodes and the set of the second internal electrodes is disposed in association with central portions of the chambers and other one of the set of the first internal electrodes and the set of the second internal electrodes is disposed in association with the partition walls.

21. The fluid jet apparatus according to claim 15, wherein the drive electrodes are formed on a surface of the piezoelectric plate at a side of the chamber plate unit and a surface opposite to the side of the chamber plate unit.

22. The fluid jet apparatus according to claim 20, wherein the chambers are provided in the one direction with a space therebetween to form a row of the chambers, and a plurality of rows of the chambers are provided in a direction perpendicular to the one direction, and wherein one of the set of the first internal electrodes and the set of the second internal electrodes is disposed in association with central portions of the chambers in each of the rows of the chambers and other one of the set of the first internal electrodes and the set of the second internal electrodes is disposed in association with the partition walls in each of the rows of the chambers.

23. A method of manufacturing a fluid jet apparatus, comprising the steps of:

forming in a piezoelectric plate that is made of at least one sheet of piezoelectric material, a first internal electrode pattern including a set of a plurality of first internal electrodes disposed in one direction with a space therebetween and a first lead that interconnects the first internal electrodes, and a second internal electrode pattern including a set of a plurality of second internal electrodes disposed in the one direction so as to correspond to the set of the first internal electrodes with a space between the set of the first internal electrodes and the set of the second internal electrodes and a second lead that interconnects the set of the second internal electrodes;

polarizing the piezoelectric material between the set of the first internal electrodes and the set of the second internal electrodes in the one direction by applying an electric field between the set of the first internal electrodes and the set of the second internal electrodes through the first lead and the second lead;

separating at least one of the set of the first internal electrodes and the set of the second internal electrodes individually after the polarizing step, by removing at least one of the first lead and the second lead;

making drive electrodes on the piezoelectric plate that generate a drive electric field in a direction perpendicular to the one direction that the piezoelectric material is polarized;

forming a chamber plate unit that includes a plurality of chambers separated by partition walls and nozzles connected to the chambers to eject fluid from the chambers; and bonding the piezoelectric plate to the chamber plate unit such that a portion of the piezoelectric plate that is polarized is associated with each of the chambers.

24. The method according to claim 23, wherein the step of forming the chamber plate unit includes arranging the chambers in a plurality of rows and columns, and wherein the step of forming the first and second internal electrode patterns, includes providing one of the set of the first internal electrodes and the set of the second internal electrodes in a plurality of rows and columns in association with the chambers arranged in the plurality of rows and columns, and providing other one of the set of the first internal electrodes and the set of the second internal electrodes in a plurality of rows and columns so as to place an internal electrode in the one of the set between two internal electrodes in the other one of the set.

25. The method according to claim 24, wherein the one of the set of the first internal electrodes and the set of the second internal electrodes are formed in association with central portions of the chambers and the other one of the set of the first internal electrodes and the set of the second internal electrodes are formed in association with the partition walls.

26. The method according to claim 23, further comprising the steps of producing a plurality of sheets of the piezoelectric material and laminating the plurality of the sheets, wherein the step of forming the first internal electrode pattern and the second internal electrode pattern occurs before the step of laminating the sheets.

27. The method according to claim 26, wherein the step of separating includes forming a groove in the laminated sheets.

28. The method according to claim 27, wherein the step of forming the groove includes having a groove width equal to or greater than a width of the at least one of the first lead and the second lead.

* * * * *